US010250219B2

(12) United States Patent
Hatakeyama et al.

(10) Patent No.: US 10,250,219 B2
(45) Date of Patent: Apr. 2, 2019

(54) ACOUSTIC WAVE DEVICE

(71) Applicant: TAIYO YUDEN CO., LTD., Tokyo (JP)

(72) Inventors: Kazushige Hatakeyama, Tokyo (JP); Takuma Kuroyanagi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 136 days.

(21) Appl. No.: 15/430,849

(22) Filed: Feb. 13, 2017

(65) Prior Publication Data

US 2017/0346463 A1 Nov. 30, 2017

(30) Foreign Application Priority Data

May 26, 2016 (JP) .................... 2016-105001

(51) Int. Cl.
*H03H 9/02* (2006.01)
*H03H 9/10* (2006.01)
(Continued)

(52) U.S. Cl.
CPC .... *H03H 9/02913* (2013.01); *H03H 9/02086* (2013.01); *H03H 9/0523* (2013.01);
(Continued)

(58) Field of Classification Search
CPC .. H03H 9/0523; H03H 9/0547; H03H 9/0571; H03H 9/0576; H03H 9/64; H03H 9/02086; H03H 9/02125; H03H 9/02818; H03H 9/02913; H03H 9/1014; H03H 9/1071
(Continued)

(56) References Cited

U.S. PATENT DOCUMENTS 5,699,027 A * 12/1997 Tsuji .................... H03H 9/0547
310/313 R
2006/0249824 A1 11/2006 Lee et al.
(Continued)

FOREIGN PATENT DOCUMENTS

JP 2000-236230 A 8/2000
JP 2007-67617 A 3/2007
(Continued)

OTHER PUBLICATIONS

Japanese Office Action dated Nov. 20, 2018, in a counterpart Japanese patent application No. 2016-105001. (A machine translation (not reviewed for accuracy) attached.).

*Primary Examiner* — Robert J Pascal
*Assistant Examiner* — Jorge L Salazar, Jr.
(74) *Attorney, Agent, or Firm* — Chen Yoshimura LLP

(57) ABSTRACT

An acoustic wave device includes: a first substrate that includes a first acoustic wave filter located on an upper surface of the first substrate; a second substrate that is flip-chip mounted on the upper surface of the first substrate through a bump, and includes a second acoustic wave filter on a lower surface of the second substrate, the lower surface of the second substrate facing the upper surface of the first substrate across an air gap; and a shield electrode that is supported by the upper surface of the first substrate, and is located between at least a part of the first acoustic wave filter and at least a part of the second acoustic wave filter through the air gap.

12 Claims, 16 Drawing Sheets

(51) Int. Cl.
 *H03H 9/64* (2006.01)
 *H03H 9/05* (2006.01)
(52) U.S. Cl.
 CPC ........ *H03H 9/0547* (2013.01); *H03H 9/0571* (2013.01); *H03H 9/0576* (2013.01); *H03H 9/1014* (2013.01); *H03H 9/1071* (2013.01); *H03H 9/64* (2013.01)
(58) Field of Classification Search
 USPC .................. 333/133, 187, 188, 193–196
 See application file for complete search history.

(56) References Cited

U.S. PATENT DOCUMENTS

| | | |
|---|---|---|
| 2007/0115079 A1 | 5/2007 | Kubo et al. |
| 2009/0224851 A1 | 9/2009 | Feiertag et al. |
| 2012/0176206 A1 | 7/2012 | Inoue et al. |
| 2013/0062995 A1 | 3/2013 | Matsuda et al. |
| 2014/0118094 A1 | 5/2014 | Matsuda |
| 2015/0123744 A1 | 5/2015 | Nishimura et al. |

FOREIGN PATENT DOCUMENTS

| | | |
|---|---|---|
| JP | 2008-546207 A | 12/2008 |
| JP | 4375399 B2 | 12/2009 |
| JP | 2011-071874 A | 4/2011 |
| JP | 2013-058911 A | 3/2013 |
| JP | 2014-093590 A | 5/2014 |
| JP | 2015-91065 A | 5/2015 |

\* cited by examiner

ACOUSTIC WAVE DEVICE

CROSS-REFERENCE TO RELATED APPLICATION

This application is based upon and claims the benefit of priority of the prior Japanese Patent Application No. 2016-105001, filed on May 26, 2016, the entire contents of which are incorporated herein by reference.

FIELD

A certain aspect of the present invention relates to an acoustic wave device.

BACKGROUND

As a packaging method of an acoustic wave device, there has been known a method that face-down mounts a chip including an acoustic wave element, and covers the periphery of the chip by a sealing member. Japanese Patent Application Publication No. 2008-546207 (Patent Document 1) describes that two substrates each including an acoustic wave element formed on the surface thereof are bonded together through an interlayer so that the acoustic wave elements face each other across an air gap.

The acoustic wave device can be downsized by forming acoustic wave filters on different surfaces and stacking them. However, the acoustic wave filters interfere with each other, and thereby, the isolation characteristic deteriorates.

SUMMARY OF THE INVENTION

According to an aspect of the present invention, there is provided an acoustic wave device including: a first substrate that includes a first acoustic wave filter located on an upper surface of the first substrate; a second substrate that is flip-chip mounted on the upper surface of the first substrate through a bump, and includes a second acoustic wave filter on a lower surface of the second substrate, the lower surface of the second substrate facing the upper surface of the first substrate across an air gap; and a shield electrode that is supported by the upper surface of the first substrate, and is located between at least a part of the first acoustic wave filter and at least a part of the second acoustic wave filter through the air gap.

DETAILED DESCRIPTION

Hereinafter, a description will be given of embodiments of the present invention with reference to the accompanying drawings.

First Embodiment

Figure 1:
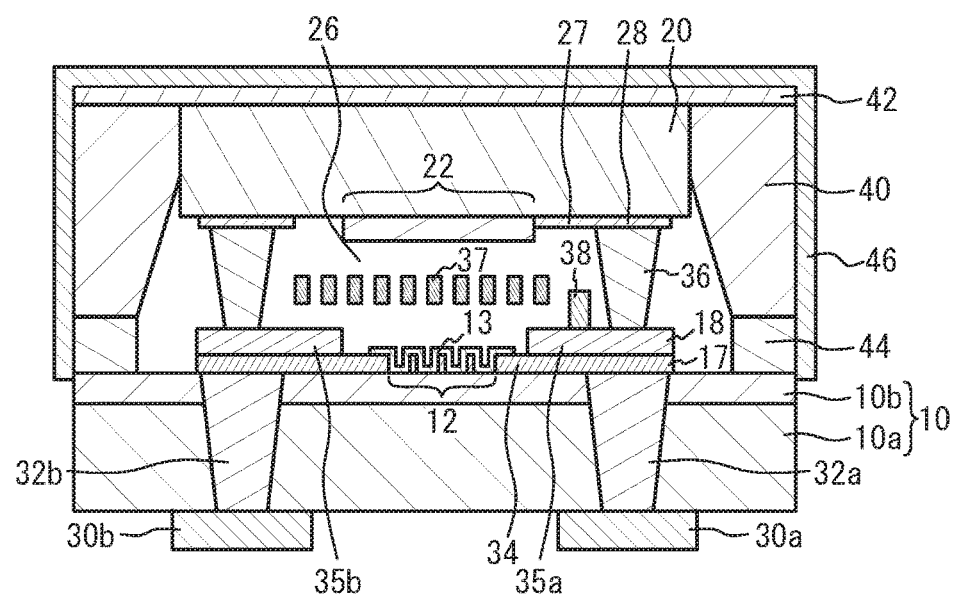
FIG. 1 is a cross-sectional view of an acoustic wave device in accordance with a first embodiment.

FIG. 1 is a cross-sectional view of an acoustic wave device in accordance with a first embodiment. As illustrated in FIG. 1, a substrate 20 is mounted on a substrate 10. The substrate 10 includes a support substrate 10a and a piezoelectric substrate 10b. The support substrate 10a is, for example, a sapphire substrate, a spinel substrate, an alumina substrate, or a silicon substrate. The piezoelectric substrate 10b is, for example, a lithium tantalate substrate or a lithium niobate substrate. The piezoelectric substrate 10b is bonded on the upper surface of the support substrate 10a. The bonded surface of the piezoelectric substrate 10b and the support substrate 10a is a plane surface and flat.

Located on the upper surface of the substrate 10 are an acoustic wave resonator 12, wiring lines 34, pads 35a and 35b, and a ring-shaped electrode 44. The acoustic wave resonator 12 and the wiring lines 34 are formed of a metal layer 17, and the pads 35a and 35b are formed of the metal layer 17 and a metal layer 18 formed on the metal layer 17. The wiring lines 34 may be formed of the metal layers 17 and 18. In the acoustic wave resonator 12, a protective film 13 made of an insulating material may be located on the metal layer 17. The metal layer 17 is, for example, an aluminum layer or a copper layer. The metal layer 18 is, for example, a copper layer or a gold layer.

Terminals 30a and 30b are located on the lower surface of the substrate 10. The terminals 30a and 30b are foot pads for connecting the acoustic wave resonators 12 and 22 to external devices. Via wirings 32a and 32b penetrating through the substrate 10 are formed. The via wiring 32a electrically connects the pad 35a and the terminal 30a, and the via wiring 32b electrically connects the pad 35b and the terminal 30b. A shield electrode 37 is located above the acoustic wave resonator 12 through an air gap 26. A support 38 is located on the pad 35a. The support 38 supports the shield electrode 37 above the upper surface of the substrate 10. The terminals 30a and 30b, the via wirings 32a and 32b, the shield electrode 37, and the support 38 are formed of a metal layer such as for example, a copper layer, an aluminum layer, or a gold layer. The ring-shaped electrode 44 is formed of a metal layer such as a nickel layer.

Located on the lower surface of the substrate 20 are the acoustic wave resonator 22, wiring lines 27, and pads 28. The substrate 20 is, for example, an insulating substrate such as a glass substrate or a semiconductor substrate such as a silicon substrate. The pad 28 is formed of a metal layer such as, for example, a copper layer, an aluminum layer, or a gold layer. The substrate 20 is flip-chip mounted (face-down mounted) on the substrate 10 through bumps 36. The bumps 36 are, for example, gold bumps, solder bumps, or copper bumps.

A ring-shaped sealing portion 40 is located on the ring-shaped electrode 44. The ring-shaped sealing portion 40 surrounds the substrate 20. A flat plate-like lid 42 is located on the upper surface of the substrate 20 and the upper surface of the ring-shaped sealing portion 40. A protective film 46 is located so as to cover the ring-shaped electrode 44, the ring-shaped sealing portion 40, and the lid 42. The ring-shaped sealing portion 40 is formed of, for example, a metal layer such as a solder layer or an insulating layer such as a resin layer. The lid 42 is, for example, a metal plate or an insulating plate. The protective film 46 is a metal film or an insulating film. The ring-shaped sealing portion 40 is formed of a metal layer such as a gold layer, a copper layer, or a solder layer, or an insulating layer such as a resin layer. The upper surface of the substrate 10 and the lower surface of the substrate 20 face each other across the air gap 26. Accordingly, the acoustic wave resonators 12 and 22 face each other across the air gap 26. The air gap 26 is sealed by the ring-shaped sealing portion 40, and the substrates 10 and 20. The bumps 36 are surrounded by the air gap 26.

The terminals 30a and 30b are electrically connected to the acoustic wave resonator 12 through the via wirings 32a and 32b, the pads 35a and 35b, and the wiring lines 34, respectively, and are further electrically connected to the acoustic wave resonator 22 through the bumps 36, the pads 28, and the wiring lines 27. The terminal 30a is electrically connected to the shield electrode 37 through the pad 35a and the support 38. The shield electrode 37 can be grounded by supplying a ground potential to the terminal 30a.

Figure 2A:
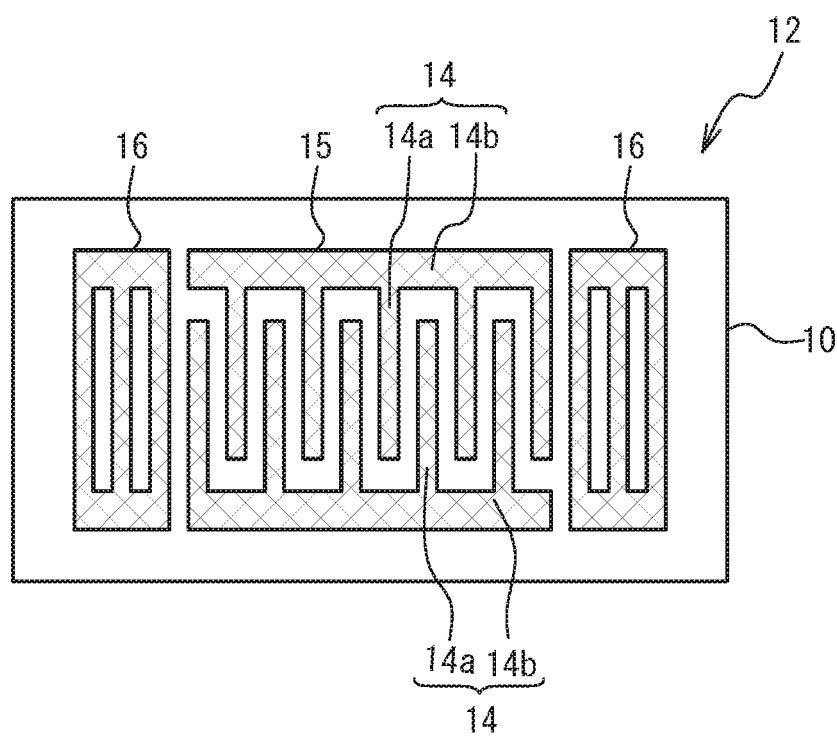
FIG. 2A is a plan view of an acoustic wave resonator 12.
Figure 2B:
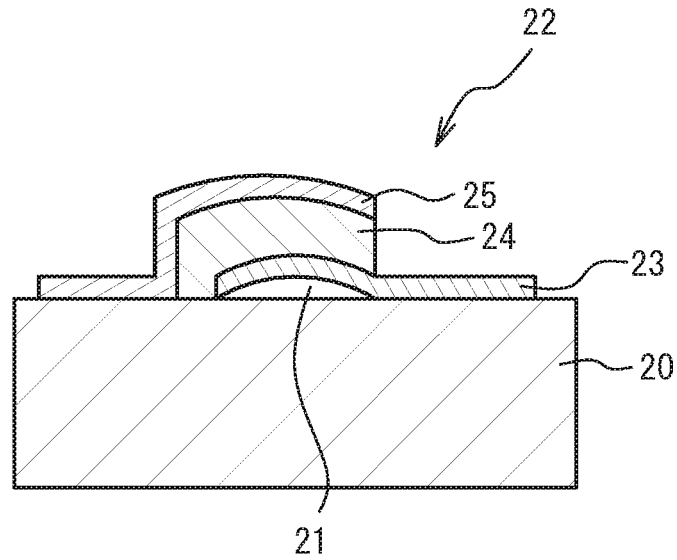
FIG. 2B is a cross-sectional view of an acoustic wave resonator 22.

FIG. 2A is a plan view of the acoustic wave resonator 12, and FIG. 2B is a cross-sectional view of the acoustic wave resonator 22. As illustrated in FIG. 2A, the acoustic wave resonator 12 is a surface acoustic wave resonator. An Inter-digital Transducer (IDT) 15 and reflectors 16 are formed on the substrate 10. The IDT 15 includes a pair of comb-shaped electrodes 14 facing each other. The comb-shaped electrode 14 includes a plurality of electrode fingers 14a and a bus bar 14b to which the electrode fingers 14a are connected. The reflectors 16 are located at both sides of the IDT 15. The IDT 15 excites a surface acoustic wave in the piezoelectric substrate 10b. The IDT 15 and the reflectors 16 are formed of the metal layer 17 in FIG. 1.

As illustrated in FIG. 2B, the acoustic wave resonator 22 is a piezoelectric thin film resonator. A piezoelectric film 24 is located on the substrate 20. A lower electrode 23 and an upper electrode 25 are located so as to sandwich the piezoelectric film 24. An air gap 21 is formed between the lower electrode 23 and the substrate 20. The lower electrode 23 and the upper electrode 25 excite an acoustic wave in the thickness extension mode in the piezoelectric film 24. The lower electrode 23 and the upper electrode 25 are formed of a metal film such as, for example, a ruthenium film. The piezoelectric film 24 is, for example, an aluminum nitride film. The acoustic wave resonators 12 and 22 include electrodes exciting acoustic waves. Thus, the acoustic wave resonators 12 and 22 are covered with the air gap 26 so as not to restrain the acoustic waves.

Figure 3:
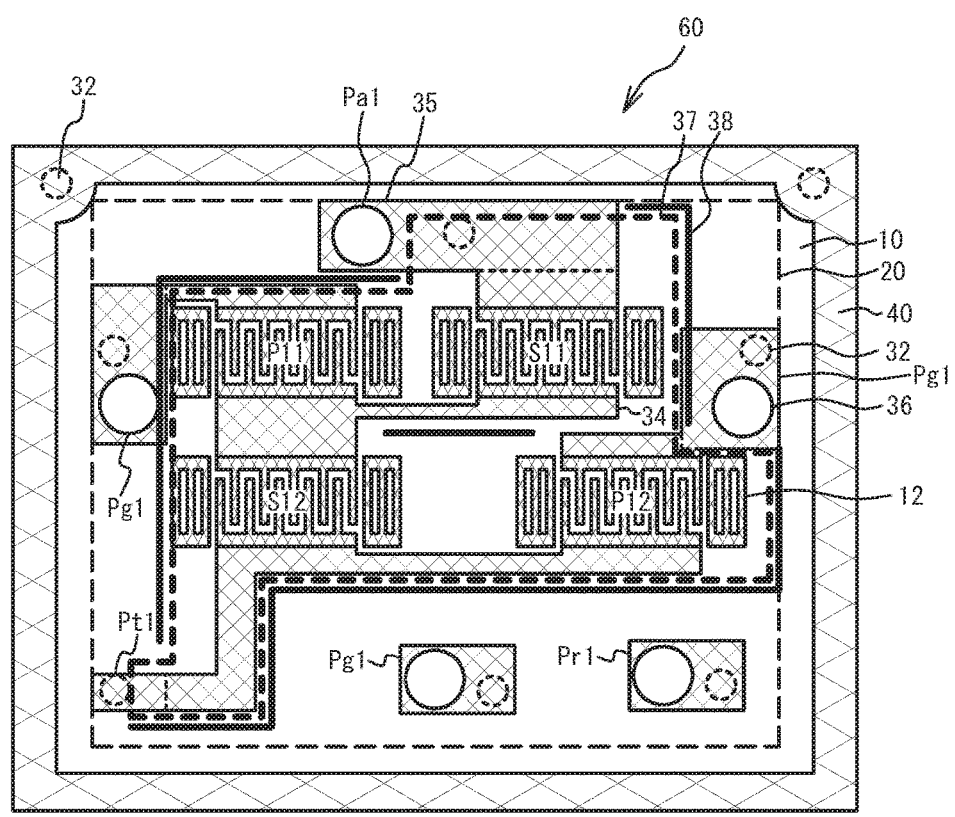
FIG. 3 is a plan view of the upper surface of a substrate 10 in the first embodiment.

FIG. 3 is a plan view of the upper surface of the substrate 10 in the first embodiment. As illustrated in FIG. 3, a plurality of the acoustic wave resonators 12, the wiring lines 34, pads 35, and the ring-shaped sealing portion 40 are located on the upper surface of the substrate 10. The bumps 36 are located on the pads 35. The via wirings 32 connecting to the pads 35 are formed in the substrate 10. The pads 35 include a common pad Pa1, a transmit pad Pt1, a receive pad Pr1, and ground pads Pg1. The ground pad Pg1 corresponds to the pad 35a in FIG. 1. A transmit filter 60 is a ladder-type filter, and includes series resonators S11 and S12 and parallel resonators P11 and P12 that are the acoustic wave resonators 12. The series resonators S11 and S12 are connected in series between the common pad Pa1 and the transmit pad Pt1 through the wiring lines 34. The parallel resonators P11 and P12 are connected in parallel between the common pad Pa1 and the transmit pad Pt1 through the wiring lines 34. The parallel resonators P11 and P12 are connected to the ground pads Pg1 through the wiring lines 34.

In FIG. 3, the support 38 is indicated by a solid line, and the region in which the shield electrode 37 is to be located is indicated by a dashed line. The support 38 is located on the upper surface of the substrate 10. The shield electrode 37 connecting to the support 38 is provided. The shield electrode 37 is coupled to the ground pad Pg1 through the support 38. This structure allows the shield electrode 37 to be grounded.

Figure 4:
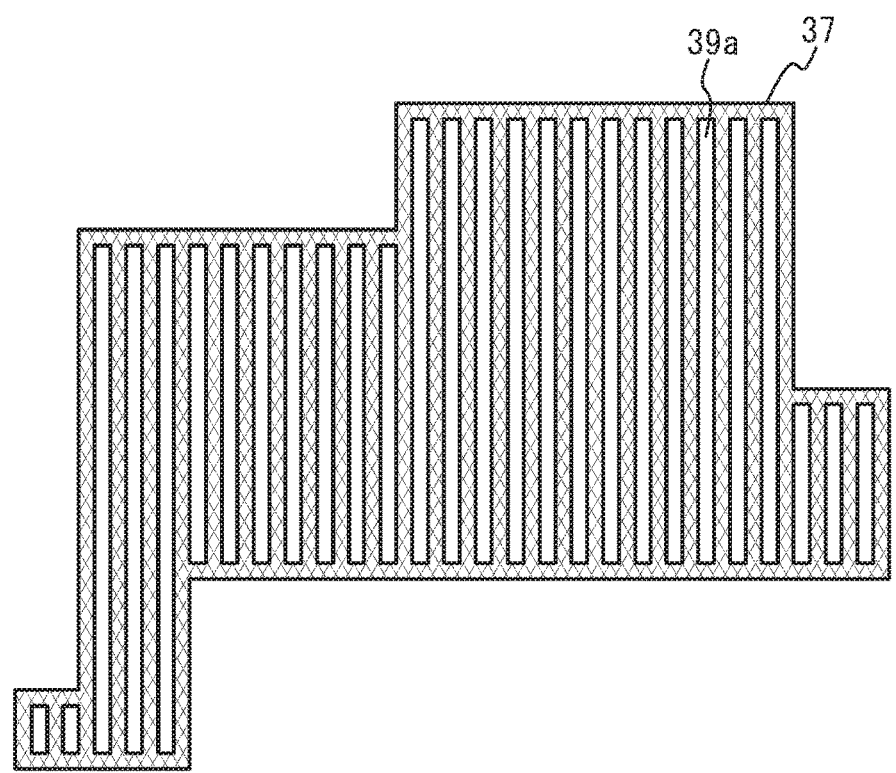
FIG. 4 is a plan view of a shield electrode in the first embodiment.

FIG. 4 is a plan view of the shield electrode in the first embodiment. As illustrated in FIG. 4, a plurality of slits 39a are formed in the shield electrode 37. The slits 39a extend in the extension direction of the electrode fingers of the acoustic wave resonator 12. A part of the frame of the shield electrode 37 functions as the support 38. The shield electrode 37 has a film thickness of, for example, 0.5 to 5 μm, and the slit 39a has a width of, for example, 1 to 5 μm. The width of the shield electrode 37 between the slits 39a is, for example, 0.5 to 5 μm. The shield electrode 37 is formed of a metal layer such as a copper layer, a gold layer, a platinum layer, or an aluminum layer that has a low resistance and is non-magnetic.

Figure 5:
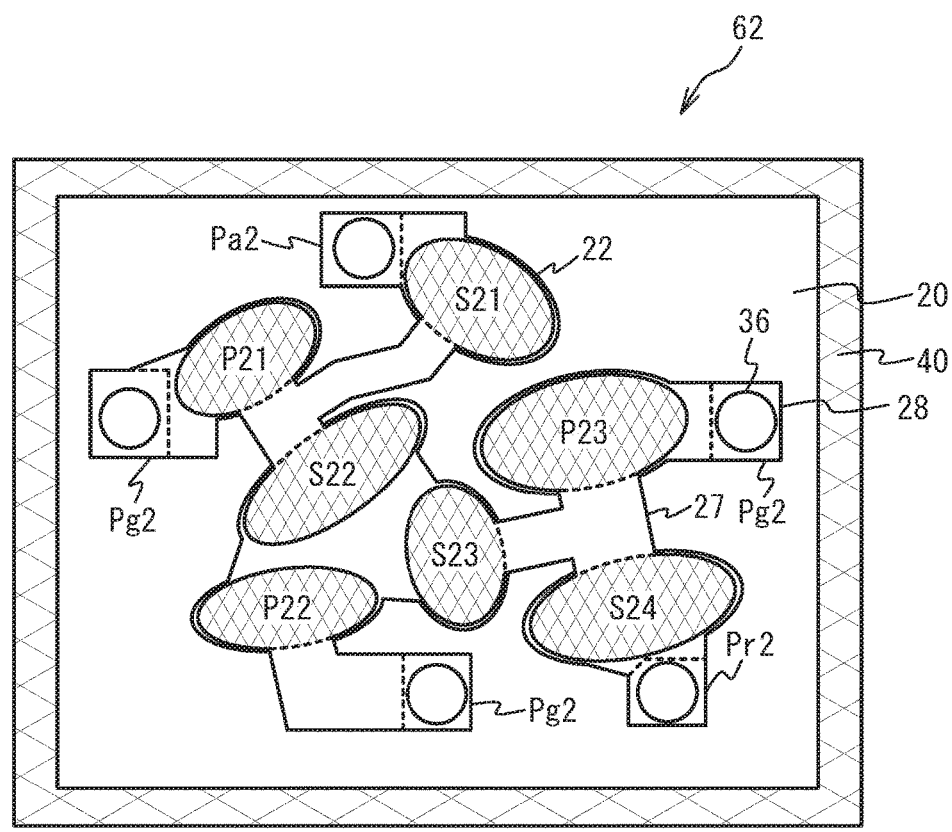
FIG. 5 is a plan view of the lower surface of a substrate 20 in the first embodiment.

FIG. 5 is a plan view of the lower surface of the substrate 20 in the first embodiment. To make the correspondence between FIG. 5 and FIG. 3 easier to understand, FIG. 5 is a plan view transparently illustrated from above the substrate 20. As illustrated in FIG. 5, a plurality of the acoustic wave resonators 22, the wiring lines 27, the pads 28, and the ring-shaped sealing portion 40 are located on the lower surface of the substrate 20. The bumps 36 are located on the pads 28. The pads 28 include a common pad Pa2, a receive pad Pr2, and ground pads Pg2. A receive filter 62 is a ladder-type filter, and includes series resonators S21 through S24 and parallel resonators P21 through P23 that are the acoustic wave resonators 22. The series resonators S21 through S24 are connected in series between the common pad Pa2 and the receive pad Pr2 through the wiring lines 27. The parallel resonators P21 through P23 are connected in parallel between the common pad Pa2 and the receive pad Pr2 through the wiring lines 27. The parallel resonators P21 through P23 are connected to the ground pads Pg2 through the wiring lines 27.

Figure 6:
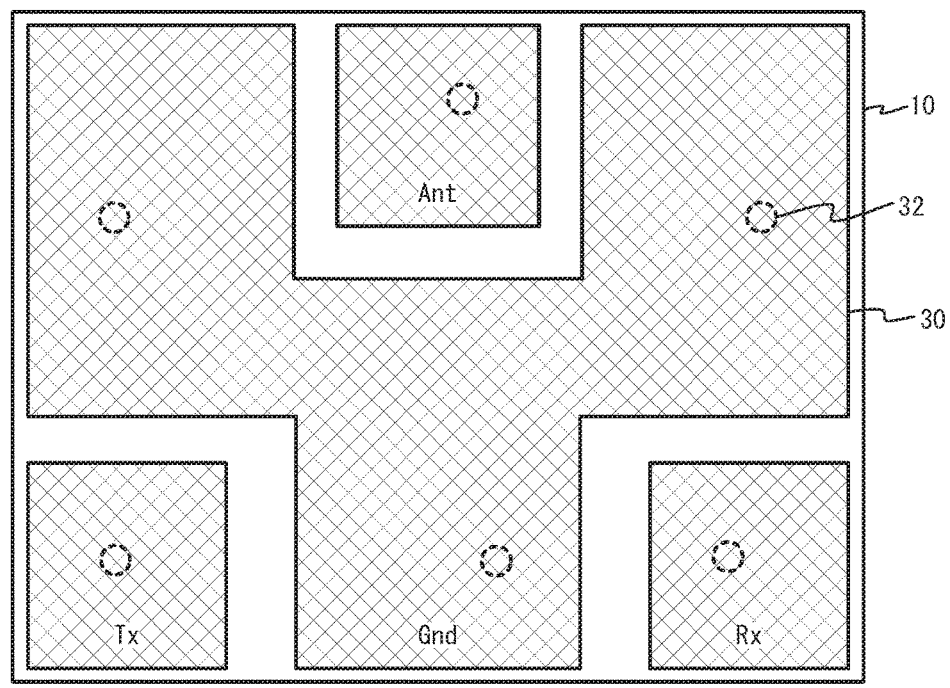
FIG. 6 is a plan view of the lower surface of the substrate 10 in the first embodiment.

FIG. 6 is a plan view of the lower surface of the substrate 10 in the first embodiment. To make the correspondence between FIG. 6 and FIG. 3 easier to understand, FIG. 6 is a plan view transparently illustrated from above the substrate 10. As illustrated in FIG. 6, terminals 30 are located on the lower surface of the substrate 10. The terminals 30 include a common terminal Ant, a transmit terminal Tx, a receive terminal Rx, and a ground terminal Gnd. The common terminal Ant is electrically connected to the common pad Pa1 through the via wiring 32, and is further electrically connected to the common pad Pa2 through the bump 36. The transmit terminal Tx is electrically connected to the transmit pad Pt1 through the via wiring 32. The receive terminal Rx is electrically connected to the receive pad Pr2 through the via wiring 32, the receive pad Pr1, and the bump 36. The ground terminal Gnd is electrically connected to the ground pad Pg1 through the via wiring 32, and is further electrically connected to the ground pad Pg2 through the bump 36.

As described above, the acoustic wave device of the first embodiment functions as a duplexer including: the transmit filter 60 connected between the common terminal Ant and the transmit terminal Tx; and the receive filter 62 connected between the common terminal Ant and the receive terminal Rx. The transmit filter 60 transmits signals in the transmit band to the common terminal Ant among high-frequency signals input from the transmit terminal Tx, and suppresses other signals. The receive filter 62 transmits signals in the receive band to the receive terminal Rx among high-frequency signals input from the common terminal Ant, and suppresses other signals.

Figure 7:
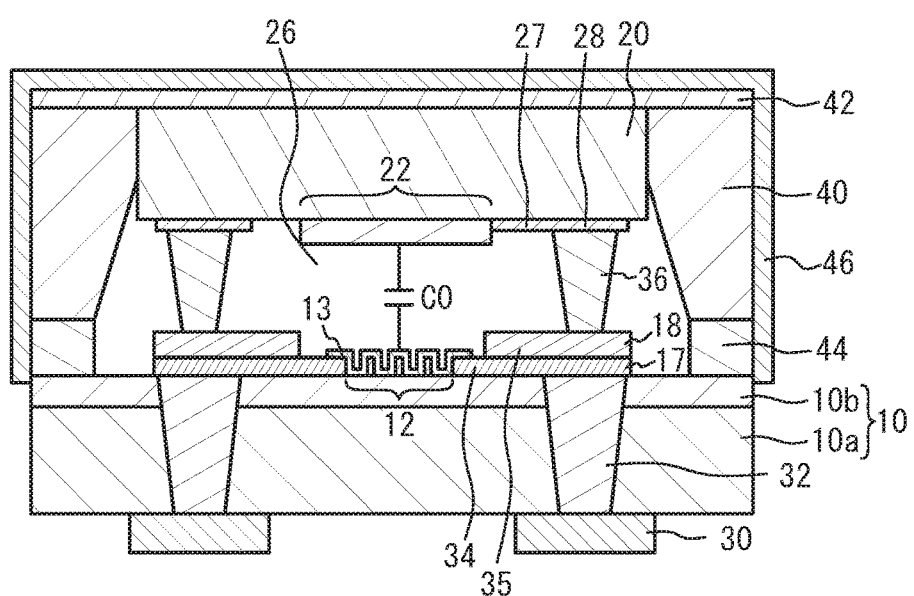
FIG. 7 is a cross-sectional view of an acoustic wave device in accordance with a first comparative example.

FIG. 7 is a cross-sectional view of an acoustic wave device in accordance with a first comparative example. As illustrated in FIG. 7, the shield electrode 37 is not located between the substrates 10 and 20. Other structures are the same as those of the first embodiment, and the description thereof is omitted.

In the first comparative example and the first embodiment, the height of the bump 36 is a several micrometers to 20 μm. Thus, the distance from the acoustic wave resonator 12 and the wiring line 34 to the acoustic wave resonator 22 and the wiring line 27 is small. As illustrated in FIG. 7, in the first comparative example, the acoustic wave resonator 12 and the wiring line 34 are capacitively coupled to the acoustic wave resonator 22 and the wiring line 27 by a parasitic capacitance C0. Accordingly, the transmit filter 60 and the receive filter 62 interfere with each other, and the isolation characteristic between the transmit filter 60 and the receive filter 62 deteriorates. For example, through the capacitive coupling, transmission signals leak to the receive terminal.

In the first embodiment, as illustrated in FIG. 1 and FIG. 3, the shield electrode 37 is supported by the upper surface of the substrate 10 (a first substrate). The shield electrode 37 is located between at least a part of the transmit filter 60 (a first acoustic wave filter) and at least a part of the receive filter 62 (a second acoustic wave filter) located on the substrate 20 (a second substrate) through the air gap 26. Accordingly, the transmit filter 60 is capacitively coupled with the shield electrode 37. Thus, the interference between the transmit filter 60 and the receive filter 62 can be inhibited, and the isolation characteristic can be improved.

Figure 8A:
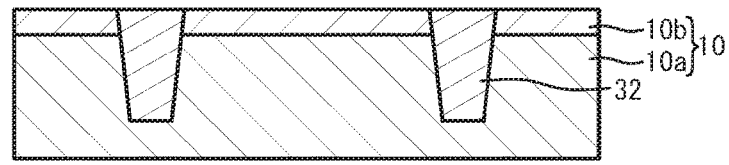
FIG. 8A through FIG. 8D are cross-sectional views (No. 1) illustrating a method of fabricating the acoustic wave device in accordance with the first embodiment.

FIG. 8A through FIG. 10C are cross-sectional views illustrating a method of fabricating the acoustic wave device in accordance with the first embodiment. As illustrated in FIG. 8A, the lower surface of the piezoelectric substrate 10b is bonded onto the upper surface of the support substrate 10a. This bonding is performed in a wafer state. The bonding may be performed by activating the upper surface of the support substrate 10a and the lower surface of the piezoelectric substrate 10b and then bonding them at normal temperature, or by bonding them with an adhesive agent. Via holes are formed in the piezoelectric substrate 10b and the support substrate 10a. The via holes are formed by, for example, irradiating the piezoelectric substrate 10b and the support substrate 10a with a laser beam. The via wirings 32 are formed in the via holes.

Figure 8B:
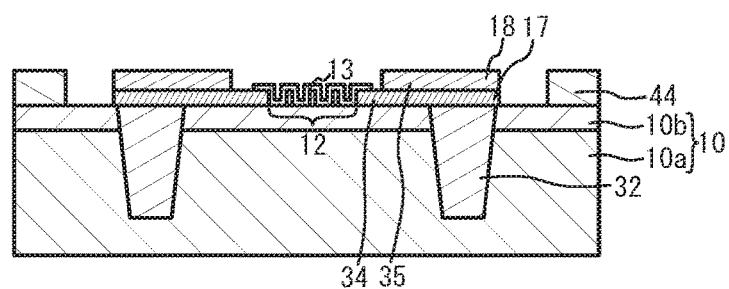

As illustrated in FIG. 8B, formed on the upper surface of the piezoelectric substrate 10b are the acoustic wave resonator 12, the wiring lines 34, the pads 35, and the ring-shaped electrode 44. The acoustic wave resonator 12 and the wiring lines 34 are formed of the metal layer 17, and the pads 35 are formed of the metal layers 17 and 18. The protective film 13 is formed so as to cover the acoustic wave resonator 12. The acoustic wave resonator 12 and the wiring lines 34 are formed of, for example, a titanium film and an aluminum film staked in this order from the substrate 10 side. The pad 35 is formed of, for example, a titanium film and a gold film stacked in this order from the substrate 10 side. Furthermore, the ring-shaped electrode 44 is formed on the piezoelectric substrate 10b. The ring-shaped electrode 44 is formed of, for example, a titanium film and a nickel film stacked in this order from the substrate 10 side, and formed by evaporation and liftoff.

Figure 8C:
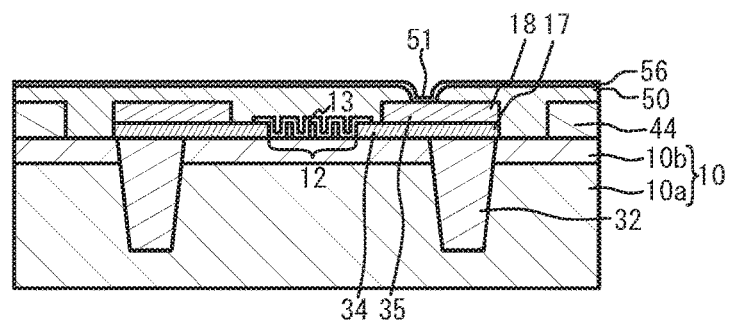

As illustrated in FIG. 8C, a protective layer 50 is formed on the substrate 10 so as to cover the acoustic wave resonator 12, the wiring lines 34, the pads 35, and the ring-shaped electrode 44. The protective layer 50 is formed of, for example, a photoresist. The protective layer 50 includes an aperture 51 in a region in which a support is to be formed. The protective layer 50 has a film thickness of, for example, 1 to 3 μm. When the protective layer 50 is thin, the shield electrode 37 and the transmit filter 60 may make contact with each other. When the protective layer 50 is thick, the shield electrode 37 may make contact with the receive filter 62. A seed layer 56 is formed on the protective layer 50. The seed layer 56 is formed of, for example, a titanium layer with a film thickness of 100 nm and a gold layer with a film thickness of 50 nm stacked in this order from the substrate 10 side. The titanium layer is an adhesion layer with the pad 35. The seed layer 56 makes contact with the pad 35 through the aperture 51 of the protective layer 50.

Figure 8D:
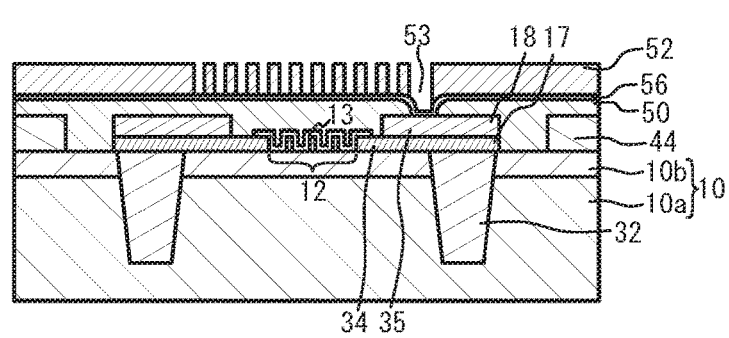

As illustrated in FIG. 8D, a mask layer 52 including apertures 53 is formed on the seed layer 56. The mask layer 52 is formed of, for example, a photoresist. The mask layer 52 has a film thickness of, for example, 5 to 10 μm so that the mask layer 52 covers the level difference of the seed layer 56 and is thicker than the shield electrode 37. The aperture 53 has a width of, for example, 5 μm, and the distance between the apertures 53 is, for example, 5 μm.

Figure 9A:
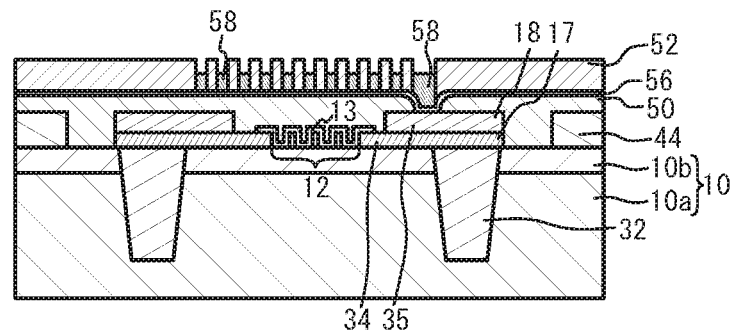
FIG. 9A through FIG. 9D are cross-sectional views (No. 2) illustrating the method of fabricating the acoustic wave device in accordance with the first embodiment.
Figure 9B:
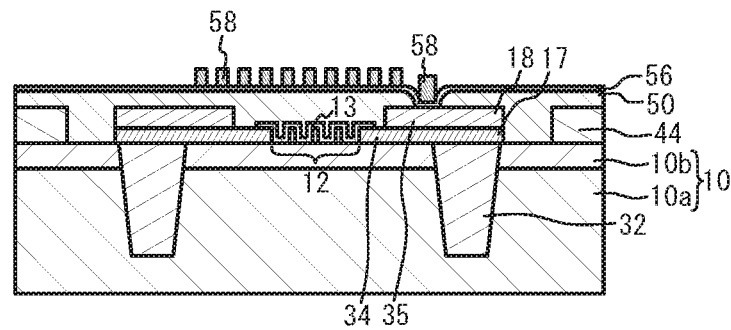

As illustrated in FIG. 9A, a plated layer 58 is electrolytically plated in the apertures 53 by supplying an electric current from the seed layer 56. The plated layer 58 is, for example, a gold layer. The plated layer 58 has a film thickness of, for example, 3 to 5 μm to secure the strength of the shield electrode 37. As illustrated in FIG. 9B, the mask layer 52 is removed by using, for example, a remover.

Figure 9C:
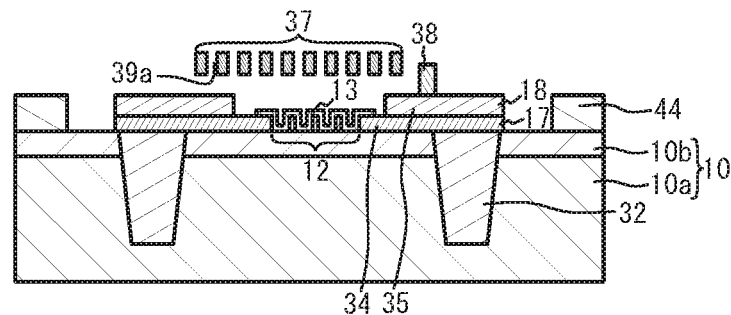

As illustrated in FIG. 9C, the seed layer 56 is removed by using the plated layer 58 as a mask. The seed layer 56 is removed by, for example, ion milling. The seed layer 56 and the plated layer 58 form the shield electrode 37 and the support 38. The slits 39a are formed in the shield electrode 37. The protective layer 50 is removed by, for example, a remover. Since the slits 39a are formed in the shield electrode 37, the remover easily penetrates between the shield electrode 37 and the substrate 10, easily eluting the protective layer 50. Accordingly, the adherence of residues to the surface of the transmit filter 60 can be inhibited.

Figure 9D:
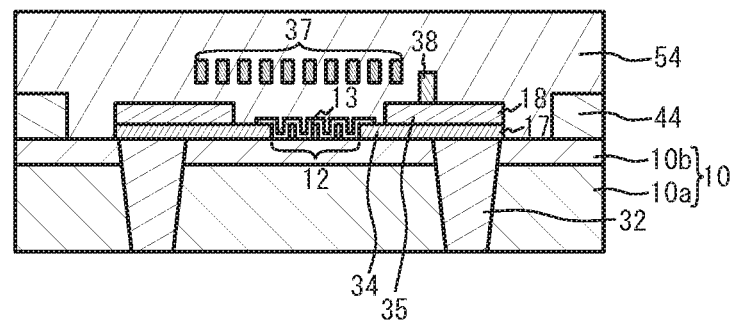

As illustrated in FIG. 9D, a protective layer 54 is formed on the substrate 10 so as to cover the acoustic wave resonator 12, the wiring lines 34, the pads 35, the shield electrode 37, and the support 38. The protective layer 54 is formed of, for example, a photoresist. The lower surface of the substrate 10 is polished or ground. This process exposes the via wirings 32 from the lower surface of the substrate 10.

Figure 10A:
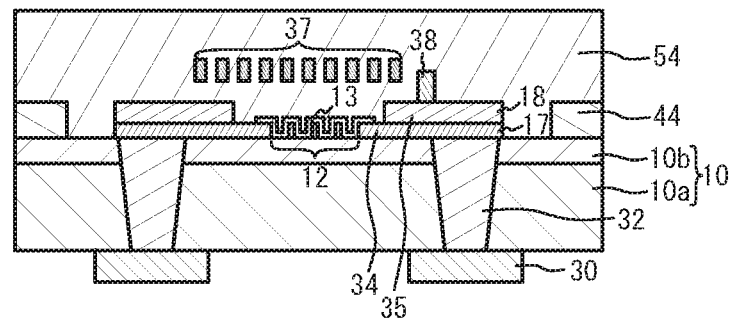
FIG. 10A through FIG. 10C are cross-sectional views (No. 3) illustrating the method of fabricating the acoustic wave device in accordance with the first embodiment.
Figure 10B:
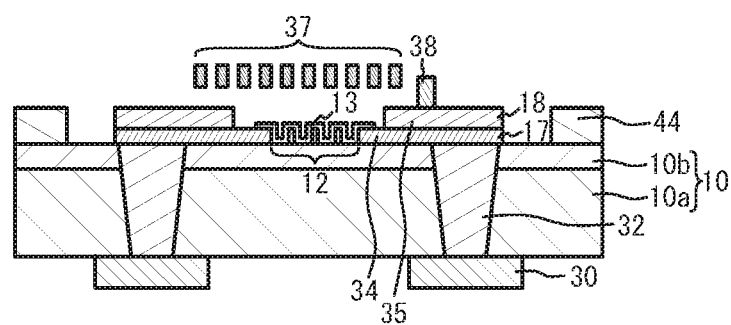
Figure 10C:
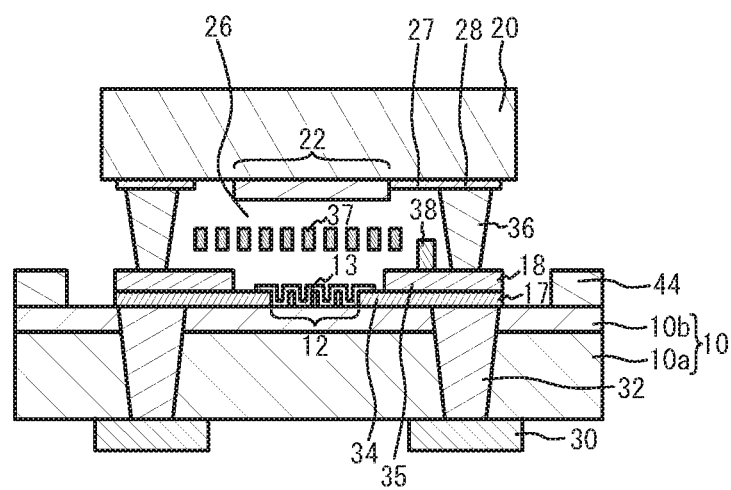

As illustrated in FIG. 10A, the terminals 30 are formed so as to make contact with the via wirings 32. The terminal 30 is formed of, for example, a titanium layer, a copper layer, a nickel layer, and a gold layer stacked in this order from the substrate 10 side. As illustrated in FIG. 10B, the protective layer 54 is removed by using, for example, a remover. As illustrated in FIG. 10C, the substrate 20 is flip-chip mounted on the substrate 10. The substrate 20 is a chip after the separation into individual chips, and for example, gold stud bumps as the bumps 36 are formed on the lower surface of the substrate 20.

Then, a solder plate is placed on the substrate 10 so as to cover the substrate 20. The lid 42 is placed on the solder plate. The solder plate is pressed to the substrate 10 by the lid 42, and the lid 42 is heated to a temperature equal to or greater than the melting point of the solder plate. This process melts the solder plate, forming the ring-shaped sealing portion 40. Since the upper surface of the ring-shaped electrode 44 has a good solderability, the ring-shaped sealing portion 40 is bonded to the substrate 10 through the ring-shaped electrode 44. Since the surface of the substrate 20 has a poor solderability, the ring-shaped sealing portion 40 is not bonded to the side surface of the substrate 20 even when making contact with the side surface of the substrate 20. The lid 42 has a good solderability, the ring-shaped sealing portion 40 is bonded to the lid 42. The lid 42 makes contact with the upper surface of the substrate 20 but is not bonded to the upper surface of the substrate 20. The lid 42, the ring-shaped sealing portion 40, and the substrate 10 are cut by dicing. The protective film 46 is formed so as to cover the side surface of the ring-shaped sealing portion 40. The protective film 46 is formed by, for example, barrel plating. These processes complete the acoustic wave device illustrated in FIG. 1.

By forming the shield electrode 37 in the above-described manner, the shield electrode 37 can be located between the acoustic wave resonators 12 and 22 even when the distance between the acoustic wave resonators 12 and 22 is 10 to 20 μm. Therefore, the height of the acoustic wave device can be reduced. In addition, since the shield electrode 37 is supported by the substrate 10, the substrate 20 can be easily mounted by flip-chip mounting the substrate 20 on the substrate 10.

Figure 11A:
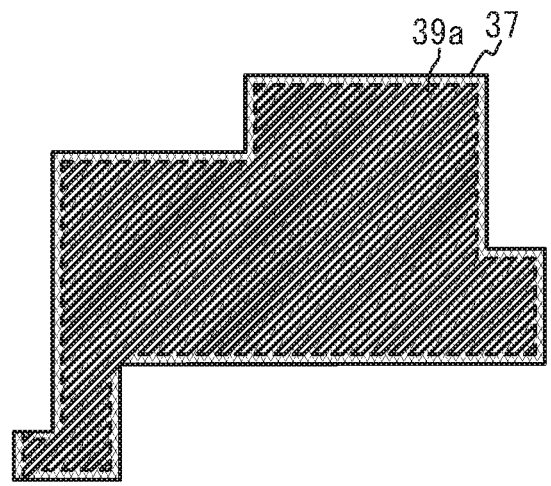
FIG. 11A through FIG. 11C illustrate other examples of the shield electrode in the first embodiment.
Figure 11B:
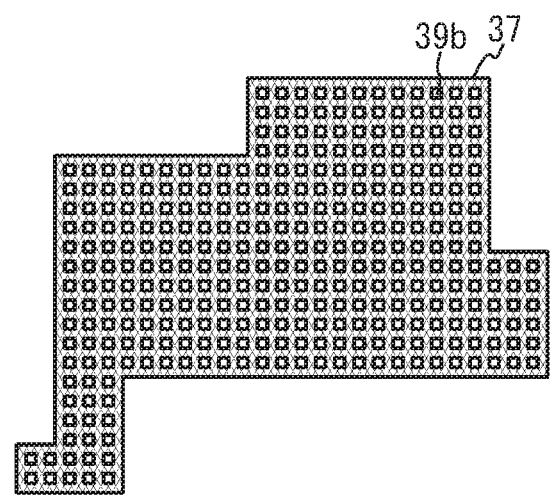
Figure 11C:
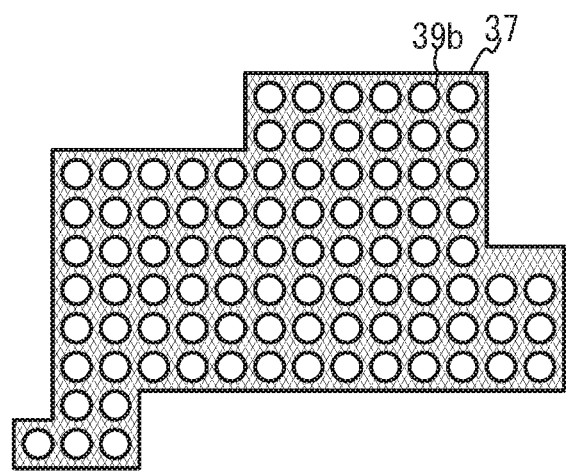

FIG. 11A through FIG. 11C illustrate other examples of the shield electrode in the first embodiment. As illustrated in FIG. 11A, the shield electrode 37 may include the slits 39a obliquely extending. As illustrated in FIG. 11B, the shield electrode 37 may include apertures 39b and may be reticulated. As illustrated in FIG. 11C, the shield electrode 37 may include the apertures 39b and may be plate-like shaped. The shape of the aperture 39b may be a polygonal shape instead of a circular shape.

Figure 12:
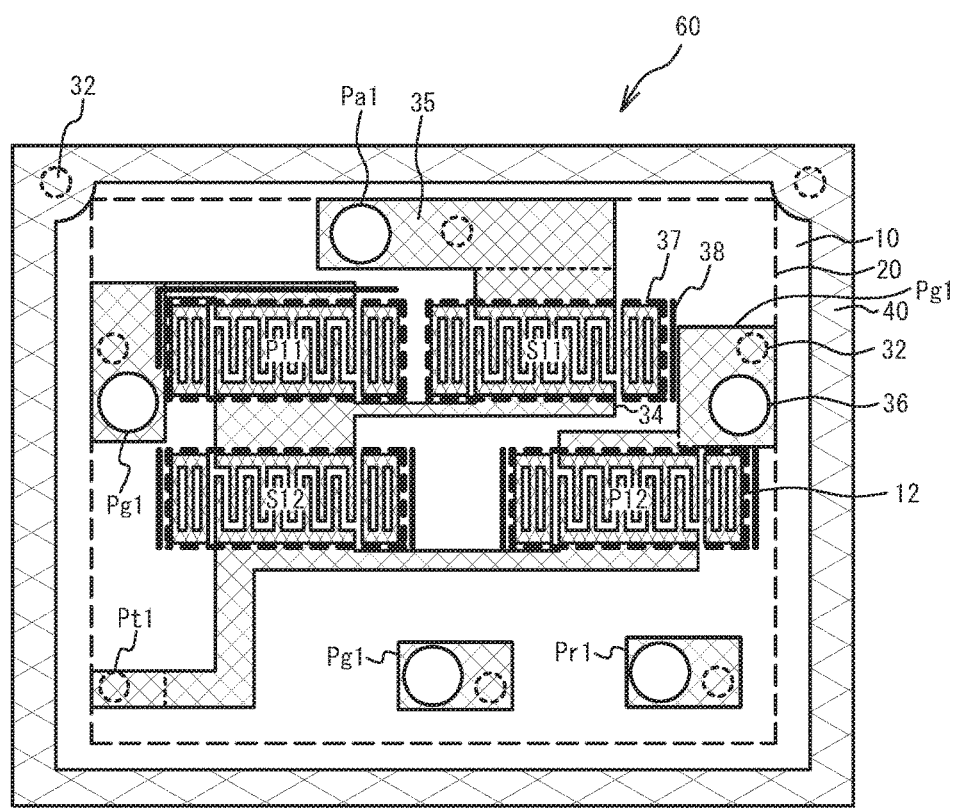
FIG. 12 is a plan view of the upper surface of the substrate 10 in a first variation of the first embodiment.

FIG. 12 is a plan view of the upper surface of the substrate 10 in a first variation of the first embodiment. As illustrated in FIG. 12, the supports 38 are located around the acoustic wave resonators 12. The shield electrode 37 is provided with respect to each acoustic wave resonator 12.

Figure 13A:
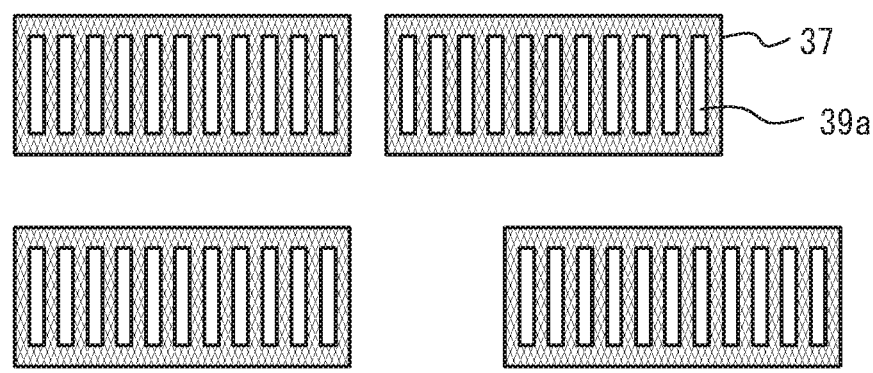
FIG. 13A and FIG. 13B illustrate examples of the shield electrode in the first variation of the first embodiment.
Figure 13B:
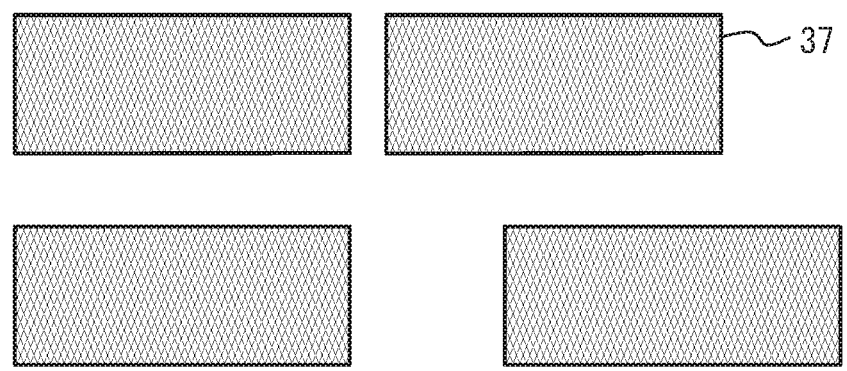

FIG. 13A and FIG. 13B illustrate examples of the shield electrode in the first variation of the first embodiment. As illustrated in FIG. 13A, the shield electrode 37 may include the slits 39a. As illustrated in FIG. 13B, the shield electrode 37 may be a solid pattern without apertures such as slits. Other structures are the same as those of the first embodiment, and thus the description thereof is omitted.

Figure 14:
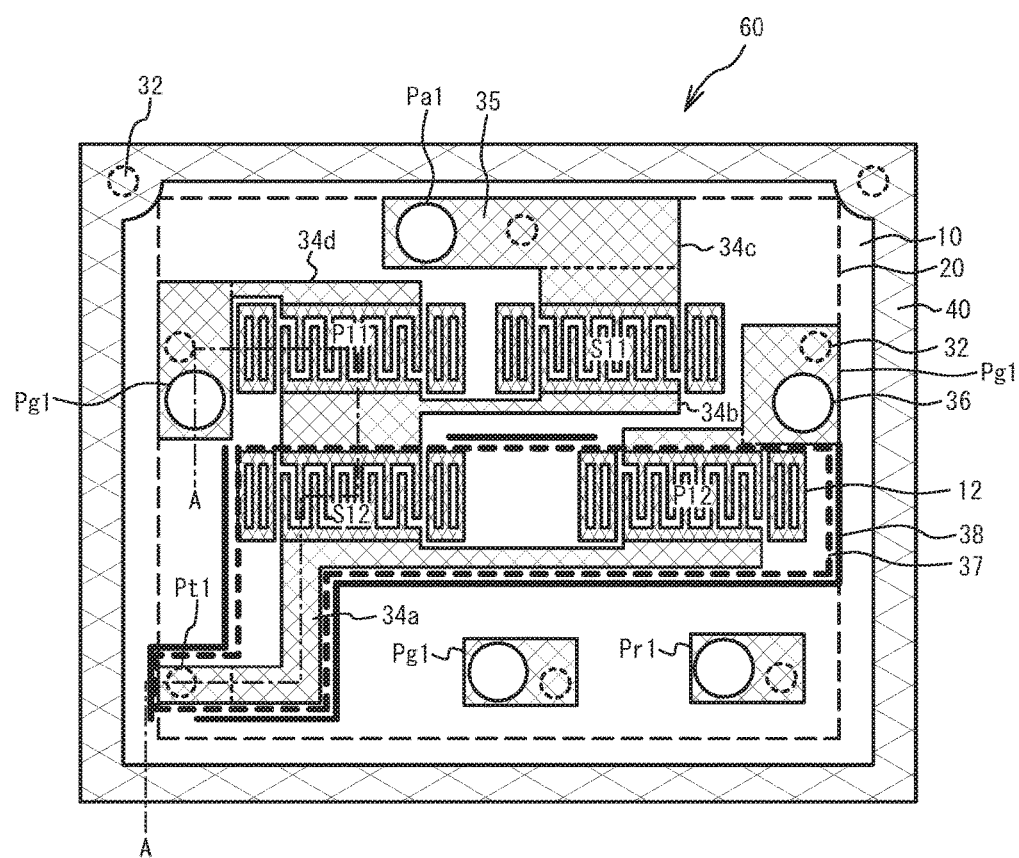
FIG. 14 is a plan view of the upper surface of the substrate 10 in a second variation of the first embodiment.
Figure 15:
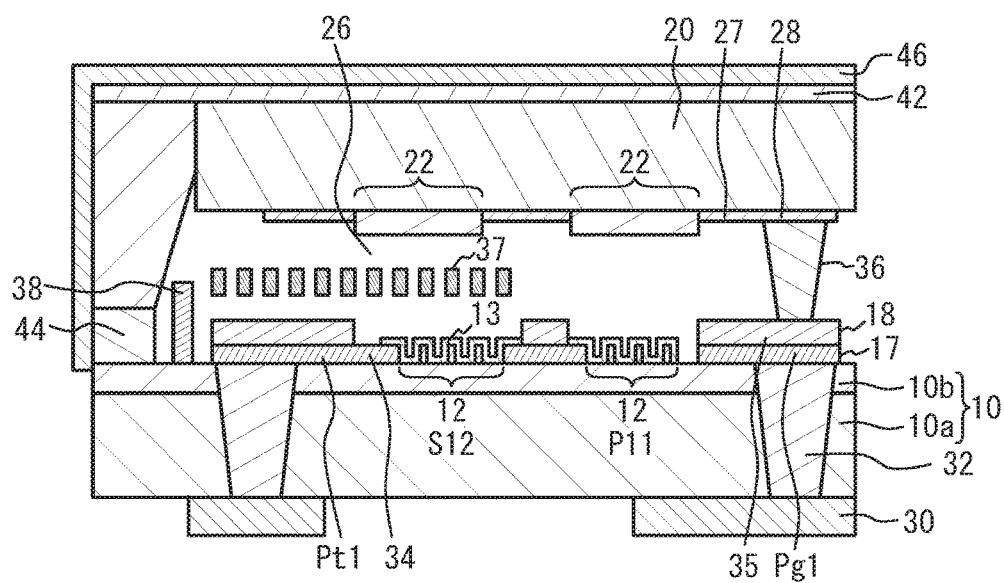
FIG. 15 is a cross-sectional view taken along line A-A in FIG. 14.

FIG. 14 is a plan view of the upper surface of the substrate 10 in a second variation of the first embodiment. FIG. 15 is a cross-sectional view taken along line A-A in FIG. 14. As illustrated in FIG. 14 and FIG. 15, the shield electrode 37 is located above the transmit pad Pt1, above a wiring line 34a connecting the transmit pad Pt1 and the acoustic wave resonator 12, and above the series resonator S12 and the parallel resonator P12. On the other hand, the shield electrode 37 is not located above a wiring line 34b interconnecting the acoustic wave resonators 12, above the common pad Pa1, above a wiring line 34c connecting the common pad Pa1 and the acoustic wave resonator 12, or above a wiring line 34d connecting the ground pad Pg1 and the acoustic wave resonator 12. The shield electrode 37 is not located above the series resonator S11 or the parallel resonator P11.

A high-frequency signal with a large electric power propagates through the transmit pad Pt1, and the wiring line 34 and the acoustic wave resonator 12 that are close to the transmit pad Pt1. Accordingly, signals easily leak to the receive filter 62. Thus, the shield electrode 37 is preferably located above the transmit pad Pt1 of the pads 35, and above the wiring line 34a close to the transmit pad Pt1 among the wiring lines 34. In addition, the shield electrode 37 is preferably located above the series resonators S12 or the parallel resonator P12 close to the transmit pad Pt1 among the acoustic wave resonators 12. Other structures are the same as those of the first embodiment, and the description thereof is thus omitted.

Figure 16:
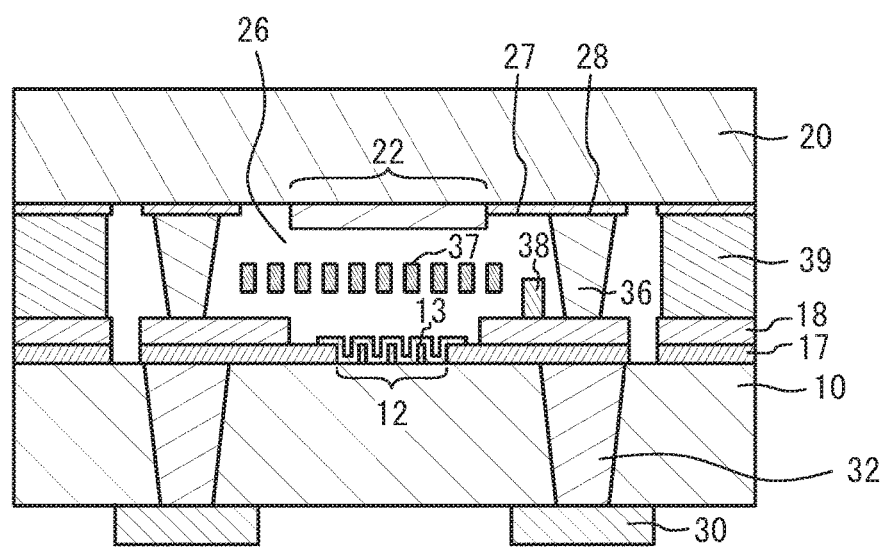
FIG. 16 is a cross-sectional view of an acoustic wave device in accordance with a third variation of the first embodiment.

FIG. 16 is a cross-sectional view of an acoustic wave device in accordance with a third variation of the first embodiment. As illustrated in FIG. 16, the bump 36 and a ring-shaped sealing portion 39 are located between the substrate 10 and the substrate 20. The ring-shaped sealing portion 39 is located in the edges of the substrates 10 and 20. Other structures are the same as those of the first embodiment, and the description thereof is omitted.

The shield electrode 37 may not necessarily include the apertures as illustrated in FIG. 13B, but preferably includes a plurality of the slits 39a or a plurality of the apertures 39b. This structure allows the protective layer 50 to be easily removed in FIG. 9C. The dimensions of the slit 39a and the aperture 39b are, for example, 1 to 5 μm considering the removing of the protective layer 50 and considering the accuracy of a pattern formation of the mask layer 52 in FIG. 8D. To remove the protective layer 50, the slits 39a are preferably provided as apertures. When the aperture is the slit 39a, to form the mask layer 52 precisely, the extension direction of the slit 39a is preferably perpendicular to the extension direction of the wiring line.

The shield electrode 37 preferably partially overlaps with at least one of a plurality of the acoustic wave resonator 12 in plan view. This structure can inhibit the capacitive coupling between the acoustic wave resonator 12 and the receive filter 62.

As illustrated in FIG. 3, the shield electrode 37 is a single body, and overlaps with at least two of a plurality of the acoustic wave resonators 12 in plan view. This structure can inhibit the capacitive coupling between a plurality of the acoustic wave resonators 12 and the receive filter 62.

As illustrated in FIG. 12, each of a plurality of the shield electrodes 37 overlaps with the corresponding one of at least two of a plurality of the acoustic wave resonators 12 in plan view. This structure can reduce the size of each shield electrode 37. Thus, the strength of the shield electrode 37 can be secured.

The transmit filter 60 is connected between the transmit terminal Tx (an input terminal to which a high-frequency signal is input) and the common terminal Ant (an output terminal from which a high-frequency signal is output). In this case, a high-frequency signal with a large electric power propagates through the transmit pad Pt1 (an input pad) and the wiring line 34a (an input wiring line) that connect the transmit terminal Tx and the acoustic wave resonator 12 closest to the transmit terminal Tx. Thus, signals easily leak to the receive filter 62 because of the capacitive coupling. The shield electrode 37 overlaps with at least a part of the transmit pad Pt1 and the wiring line 34a in plan view. This structure can inhibit the leak of signals to the receive filter 62.

The electric power of a high-frequency signal propagating through the wiring lines 34b and 34c is small. Especially, the electric power of a high-frequency signal propagating through the common pad Pa1 (an output pad) and the wiring line 34c (an output wiring line) that connect the common terminal Ant and the acoustic wave resonator 12 closest to the common terminal Ant is small. Thus, the leak of signals from the wiring lines 34b and 34c is small. Meanwhile, when the shield electrode 37 overlaps with the wiring lines 34b and 34c, parasitic capacitances are connected between the wiring lines 34b and 34c and a ground. Accordingly, the filter characteristics deteriorate. Thus, the shield electrode 37 preferably overlaps with neither of the common pad Pa1 and the wiring line 34c in plan view, more preferably overlaps with neither of the wiring lines 34b and 34c. The shield electrode 37 and the wiring lines 34b through 34d preferably do not overlap. This structure can downsize the shield electrode 37.

A high-frequency signal with the largest electric power is input to the series resonator S12 and the parallel resonator P12 that are the acoustic wave resonators located closest to the transmit terminal Tx. Accordingly, high-frequency signals easily leak from the series resonator S12 and the parallel resonator P12. Thus, the shield electrode 37 preferably overlaps with at least one of the series resonator S12 and the parallel resonator P12 in plan view.

A high-frequency signal input to the series resonator S11 and the parallel resonator P11, which are the acoustic wave resonators 12 other than the series resonator S12 and the parallel resonator P12, has a small electric power. Accordingly, the leak of signals from the series resonator S11 and the parallel resonator P11 is small. Meanwhile, when the shield electrode 37 overlaps with the series resonator S11 and the parallel resonator P11, parasitic capacitances are connected between the series resonator S11 and the parallel resonator P11 and a ground. Accordingly, the filter characteristics deteriorate. Therefore, the shield electrode 37 preferably overlaps with neither of the series resonator S11 and the parallel resonator P11 in plan view.

An exemplary case where the shield electrode 37 is formed on the substrate 10 including the transmit filter 60 formed thereon has been described, but the shield electrode 37 may be formed on the substrate 20 including the receive filter 62 formed thereon. A high-frequency signal input to the transmit filter 60 has a larger electric power than a high-frequency signal input to the receive filter 62. Thus, the shield electrode is preferably formed in the substrate 10 including the transmit filter 60 formed thereon. Especially, a high-frequency signal with the largest electric power propagates through the wiring line 34 connecting the transmit terminal Tx and the acoustic wave resonator 12 closest to the transmit terminal Tx in the transmit filter 60. Therefore, the shield electrode 37 preferably covers the wiring line 34 connecting the transmit terminal Tx and the acoustic wave resonator 12 closest to the transmit terminal Tx in the transmit filter 60.

In the substrate 10, heat is released through the via wiring 32 and the terminal 30. Therefore, the transmit filter 60, which generates larger heat, is preferably located on the substrate 10.

The transmit filter 60 and the receive filter 62 have been described as examples, but filters located on the substrate 10 and the substrate 20 may not necessarily be a transmit filter and a receive filter. For example, a filter located on the substrate 10 and a filter located on the substrate 20 may be filters each being connected between an input terminal and an output terminal, and may not necessarily be interconnected. For example, the transmit band and the receive band of the Frequency Division Duplex (FDD) system do not overlap. When the filters have different passbands (for example, when the center frequencies of the passbands differ or the passbands do not overlap), the isolation characteristic between the filters is important. Therefore, the provision of the shield electrode 37 is preferable.

An exemplary case where the receive filter 62 and the transmit filter 60 are ladder-type filters has been described, but at least one of the receive filter 62 and the transmit filter 60 may be a multimode type filter. In addition, a receive filter may be located on the substrate 10, and a transmit filter may be located on the substrate 20. An exemplary case where the piezoelectric substrate 10b is bonded on the support substrate 10a has been described, but the support substrate may not necessarily be provided.

An exemplary case where the acoustic wave resonator 12 is a surface acoustic wave resonator and the acoustic wave resonator 22 is a piezoelectric thin film resonator has been described, but the acoustic wave resonators 12 and 22 may be any one of the surface acoustic wave resonator and the piezoelectric thin film resonator. The surface acoustic wave resonator has a film thickness of approximately 0.5 µm even when including the protective film 13. In the piezoelectric thin film resonator, as illustrated in FIG. 2B, the air gap 21, the lower electrode 23, the piezoelectric film 24, and the upper electrode 25 are stacked. Thus, the film thickness of the piezoelectric thin film resonator ranges from 5 to 10 µm. When at least one of the acoustic wave resonators 12 and 22 is a piezoelectric thin film resonator, the capacitive coupling between the transmit filter 60 and the receive filter 62 easily becomes large. Thus, the provision of the shield electrode 37 is preferable. Especially when both the acoustic wave resonators 12 and 22 are piezoelectric thin film resonators, the provision of the shield electrode 37 is preferable.

When one of the acoustic wave resonators 12 and 22 is a piezoelectric thin film resonator and the other is a surface acoustic wave resonator, the shield electrode 37 is preferably formed in the substrate on which the acoustic wave surface resonator is formed. This is because the shield electrode 37 needs to be formed so as to be high from the substrate when the shield electrode 37 is formed on the substrate on which a piezoelectric thin film resonator is formed.

Although the embodiments of the present invention have been described in detail, it is to be understood that the various change, substitutions, and alterations could be made hereto without departing from the spirit and scope of the invention.

What is claimed is:

1. An acoustic wave device comprising:
   a first substrate that includes a first acoustic wave filter located on an upper surface of the first substrate;
   a second substrate that is flip-chip mounted on the upper surface of the first substrate through a bump, and includes a second acoustic wave filter on a lower surface of the second substrate, the lower surface of the second substrate facing the upper surface of the first substrate across an air gap; and
   a shield electrode that is only supported by the upper surface of the first substrate among the upper surface of the first substrate and the lower surface of the second substrate, and is located between at least a part of the first acoustic wave filter and at least a part of the second acoustic wave filter through the air gap.

2. The acoustic wave device according to claim 1, wherein the first acoustic wave filter and the second acoustic wave filter have different passbands.

3. The acoustic wave device according to claim 1, wherein the first acoustic wave filter includes a plurality of acoustic wave resonators, and the shield electrode overlaps with at least one of the plurality of acoustic wave resonators in plan view.

4. The acoustic wave device according to claim 3, wherein the shield electrode is a single body, and overlaps with at least two of the plurality of acoustic wave resonators.

5. The acoustic wave device according to claim 3, wherein the shield electrode does not overlap with a part of the plurality of acoustic wave resonators in plan view.

6. The acoustic wave device according to claim 1, wherein the first acoustic wave filter is connected between an input terminal, to which a high-frequency signal is input, and an output terminal, from which a high-frequency signal is output, and
   the shield electrode overlaps with at least a part of an input pad and an input wiring line that connect the input terminal and an acoustic wave resonator located closest to the input terminal in the first acoustic wave filter in plan view.

7. The acoustic wave device according to claim 6, wherein the shield electrode does not overlap with an output pad and an output wiring line that connect the output terminal and an acoustic wave resonator located closest to the output terminal in the first acoustic wave filter in plan view.

8. The acoustic wave device according to claim 1, wherein the first acoustic wave filter includes a plurality of acoustic wave resonators,
   the first acoustic wave filter is connected between an input terminal, to which a high-frequency signal is input, and an output terminal, from which a high-frequency signal is output, and
   the shield electrode overlaps with an acoustic wave resonator located closest to the input terminal among the plurality of acoustic wave resonators in plan view.

9. The acoustic wave device according to claim 8, wherein the shield electrode does not overlap with an acoustic wave resonator other than the acoustic wave resonator located closest to the input terminal among the plurality of acoustic wave resonators in plan view.

10. The acoustic wave device according to claim 1, wherein
    one of the first acoustic wave filter and the second acoustic wave filter is a transmit filter connected between a common terminal and a transmit terminal, and
    another one of the first acoustic wave filter and the second acoustic wave filter is a receive filter connected between the common terminal and a receive terminal.

11. An acoustic wave device comprising:
    a first substrate that includes a first acoustic wave filter located on an upper surface of the first substrate;
    a second substrate that is flip-chip mounted on the upper surface of the first substrate through a bump, and includes a second acoustic wave filter on a lower surface of the second substrate, the lower surface of the second substrate facing the upper surface of the first substrate across an air gap; and
    a shield electrode that is supported by the upper surface of the first substrate, and is located between at least a part of the first acoustic wave filter and at least a part of the second acoustic wave filter through the air gap, wherein
    the shield electrode includes a plurality of apertures.

12. An acoustic wave device comprising:
    a first substrate that includes a first acoustic wave filter located on an upper surface of the first substrate;
    a second substrate that is flip-chip mounted on the upper surface of the first substrate through a bump, and includes a second acoustic wave filter on a lower surface of the second substrate, the lower surface of the second substrate facing the upper surface of the first substrate across an air gap; and
    a shield electrode that is supported by the upper surface of the first substrate, and is located between at least a part of the first acoustic wave filter and at least a part of the second acoustic wave filter through the air gap,
    wherein
    the first acoustic wave filter includes a plurality of acoustic wave resonators, and the shield electrode overlaps with at least one of the plurality of acoustic wave resonators in plan view,
    the shield electrode comprises a plurality of shield electrodes, and each of the plurality of the shield electrodes overlaps with a corresponding one of at least two of the plurality of acoustic wave resonators.

* * * * *